United States Patent
Sanders

(10) Patent No.: US 6,502,153 B2
(45) Date of Patent: Dec. 31, 2002

(54) COMPUTER SYSTEM HAVING CONDITION SENSING FOR INDICATING WHETHER A PROCESSOR HAS BEEN INSTALLED

(75) Inventor: Michael C. Sanders, Spring, TX (US)

(73) Assignee: Compaq Information Technologies, Group, L.P., Houston, TX (US)

( * ) Notice: Subject to any disclaimer, the term of this patent is extended or adjusted under 35 U.S.C. 154(b) by 0 days.

(21) Appl. No.: 09/881,423

(22) Filed: Jun. 14, 2001

(65) Prior Publication Data

US 2001/0045816 A1 Nov. 29, 2001

Related U.S. Application Data

(63) Continuation of application No. 09/249,184, filed on Feb. 12, 1999, now Pat. No. 6,263,386.

(51) Int. Cl.[7] .............................. G06F 13/00; H05K 7/10
(52) U.S. Cl. ...................... 710/300; 710/301; 361/785; 361/809; 439/55
(58) Field of Search .................................. 710/300, 301, 710/104, 2; 712/34, 32; 361/785, 807, 809; 439/55, 68, 78; 713/300

(56) References Cited

U.S. PATENT DOCUMENTS

| | | |
|---|---|---|
| 4,084,869 A | 4/1978 | Yen ........................ 339/17 CF |
| 5,384,692 A | 1/1995 | Jaff ............................ 361/807 |
| 5,442,520 A | 8/1995 | Kemp et al. ................. 361/785 |
| 5,590,363 A | 12/1996 | Lunsford et al. ........... 395/800 |
| 5,779,502 A | * 7/1998 | Daftari et al. |
| 5,825,630 A | * 10/1998 | Taylor et al. |
| 5,832,294 A | 11/1998 | Reinschmidt .......... 395/800.32 |
| 6,108,731 A | 8/2000 | Suzuki et al. ............... 710/102 |

* cited by examiner

Primary Examiner—Gopal C. Ray
(74) Attorney, Agent, or Firm—Fletcher, Yoder & Van Someren

(57) ABSTRACT

A system for providing a signal indicating whether a process is installed and providing improved voltage regulation. A contact is selected and isolated from an array of ground contacts and is further coupled with circuit for generating an INSTALL signal. A capacitor and pull up resistor coupled to a supply voltage, ground and the isolated contact form a signal line at a common node such that a circuit to ground is completed through the processor and the isolated contact when the processor is plugged in and a direct signal indication of the presence or absence of the processor is provided. Voltage sense lines of a Voltage Regulation Module (VRM) are coupled directly to processor contacts isolated from an existing voltage supply contacts coupled to the supply plane of a supply voltage within the circuit board providing improved regulation without adversely affecting power supply current capacity considerations.

52 Claims, 4 Drawing Sheets

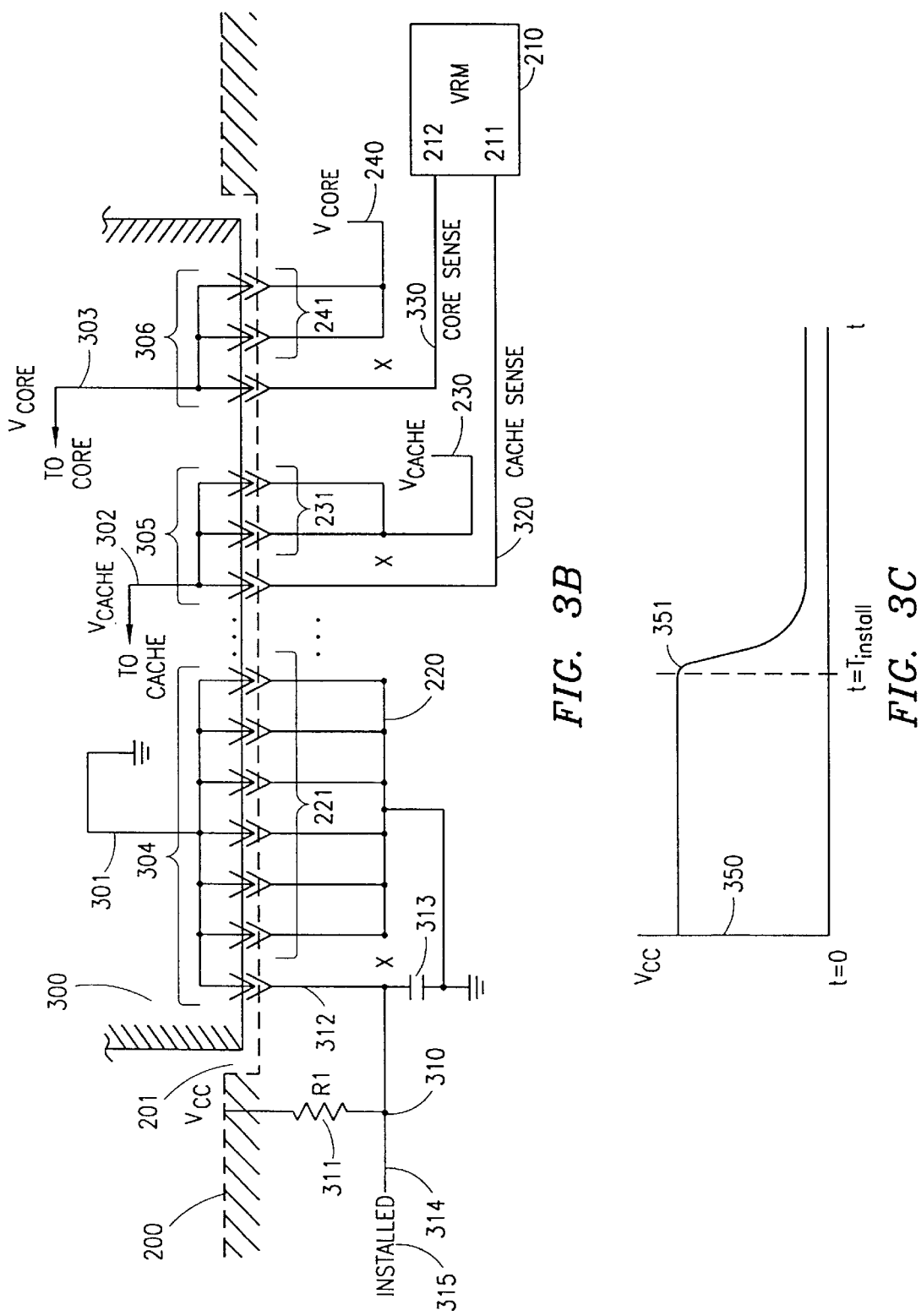

COMPUTER SYSTEM HAVING CONDITION SENSING FOR INDICATING WHETHER A PROCESSOR HAS BEEN INSTALLED

A continuation of Ser. No. 09/249,184 now U.S. Pat. No. 6,263,386 filed on Feb. 12, 1999.

FIELD OF THE INVENTION

The present invention relates to improved circuits for sensing conditions related to a processor. In particular, the present invention relates to improvements including sensing whether a processor is installed in a circuit and sensing processor supply voltages.

BACKGROUND OF THE INVENTION

As processor packaging formats become larger and more complex, containing larger memory caches and being serviced by high speed high capacity busses, problems arise related to determining whether the processor is installed, and whether voltage may be applied, and, once applied, determining how best to regulate the voltage.

In prior art processors, a loop circuit may be used to detect power enable and, by derivation whether the processor is installed and fully seated. Because of the possibility of part damage due to currents from improperly seated parts and resulting poor electrical connections, it is crucial not to apply power unless a processor is fully installed. Such currents may cause the processor itself, the package contacts, and the cartridge to be damaged. Loop circuits have been used, as noted, to derive whether the processor is seated electrically based on the power enable signal as described. Such a derived approach has disadvantages in that the signal must be present for the system to power up. This signal is inappropriate to use as an indicator of a processor or terminator card being installed.

Another factor affecting processor operation is voltage regulation. A typical VRM associated with a processor circuit board has sense lines which allow for better regulation of supplied voltages by providing references to supplied voltages. Problems arise in that sense lines for regulating voltages on a typical circuit board to which a processor may be coupled may be connected to a voltage supply plane in close proximity to the VRM. Sensing voltages at the voltage supply plane of the circuit board may not accurately reflect the true state of voltages which most affect processor operation at a point which most accurately characterizes the voltage levels as they are seen by the processor. Further, voltage drops from circuits within the processor where the supply voltages are used to voltage supply planes where voltage levels are sensed may result in poor or inadequate voltage regulation where it is needed the most, e.g. to regulate voltage supply planes used in the processor.

It would be desirable therefore for an apparatus and method for providing an indication that a processor is properly seated and ready for the application of voltage. It would further be desirable for an apparatus and method which provides for improved regulation for internal processor voltages.

SUMMARY OF THE INVENTION

The present invention overcomes the above identified problems as well as other shortcomings and deficiencies of existing technologies by providing a signal to indicate whether the processor is installed. A contact, selected and isolated from an array of contacts used to provide a ground connection for the processor is coupled with circuit for generating a corresponding INSTALL signal indicating whether a processor is installed. The circuit of the present invention allows the difference between the is installation of a processor and the installation of a socket terminator or power-enable card to be detected. One or more contacts forming a portion of the ground plane or grid of a circuit board may be isolated from an existing plurality of contacts in the ground plane. A pull up resistor may be coupled to a supply voltage and the isolated contact and a capacitor may be coupled between the isolated contact and ground plane and a signal line may be coupled to the common node between the resistor, the capacitor, and the isolated contact such that when the processor plugged in, a circuit is completed through the processor between the ground plane and the isolated contact and thus the signal line. The signal is pulled low to ground when the processor is plugged in and is pulled high when the processor is not plugged in, thus providing a direct signal indication of the presence or absence of the processor. It is to be noted that the present invention can be practiced without adversely affecting ground sourcing capacity considerations for the processor.

To further address the shortcomings of the prior art, a circuit board accommodating a processor in accordance with the present invention may include a Voltage Regulation Module (VRM) having voltage sense lines. Voltage may be sensed directly from processor contacts in contrast to sensing voltages at respective power planes or grids within the circuit board leading to improved regulation particularly as processor demands change during operation. One or more voltage sense contacts may be isolated from an existing plurality of voltage supply contacts coupled to the supply plane or grid of a respective supply voltage within the circuit board without adversely affecting power supply current capacity considerations. For example, a contact from the cache voltage supply may be isolated for sensing the cache voltage directly at the processor when plugged in. Core voltage may also be measured in a similar manner by isolating a contact associated with the core voltage supply for sensing the core voltage directly at the processor.

BRIEF DESCRIPTION OF THE DRAWINGS

A more complete understanding of the present invention may be had by reference to the following Detailed Description and appended claims when taken in conjunction with the accompanying Drawings wherein:

FIG. 3B is a schematic diagram illustrating a circuit including contacts isolated from ground and power contacts and an installed processor in accordance with the present invention; and FIG. 3C is a graph illustrating the state of an exemplary INSTALLED signal during circuit operation in accordance with the present invention.

DETAILED DESCRIPTION

Figure 1:
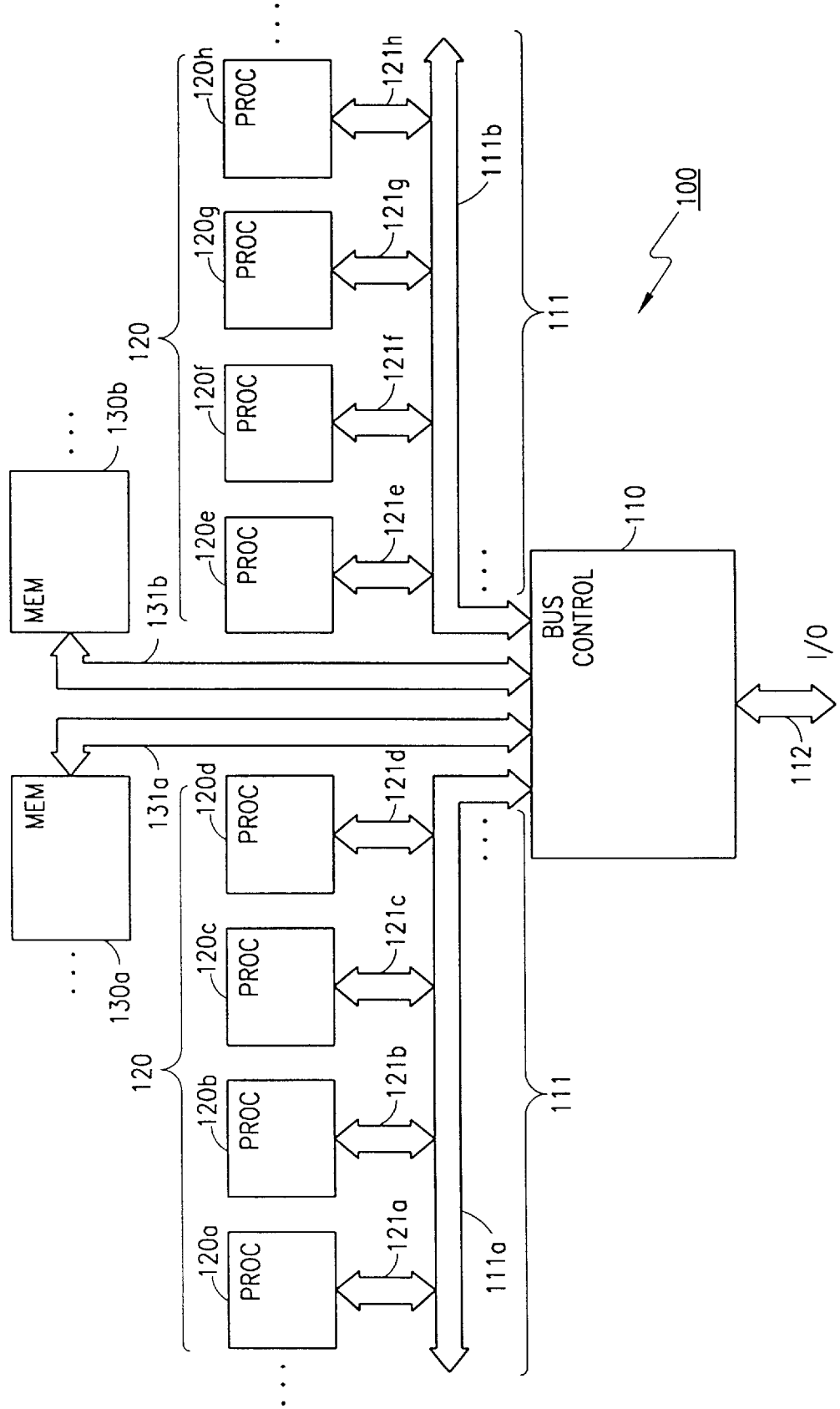
FIG. 1 is a block diagram illustrating an exemplary system in accordance with the present invention.

Referring to FIG. 1, a block diagram shows exemplary computer system 100 having multiple processors 120a–120h coupled to busses 111a and 111b through bus connections 121a–121h. In the preferred embodiment of the present invention, one or more processors may be present and, in particular, more or less than the eight processors 120a–120h may be present on one or more busses, as illustrated with exemplary busses 111a and 111b. Although two busses 111a and 111b are shown, more or fewer busses may be present in accordance with the present invention. Controller 110 may be used to manage bus activity on busses 111a and 111b and may further manage access between multiple processors 120a–120h and memory devices 130a and 130b. In the preferred embodiment of the present invention, memory devices 130a and 130b may be used to store address tags for maintaining cache coherency, as is known in the art, and may be high speed RAMs or like devices capable of fast access and data retrieval. Memory devices 130a and 130b may be accessed using busses 131a and 131b as shown in the diagram and controller 110. Controller 110 may be further coupled to additional resources including input devices such as keyboards, disk drives, additional memory, peripheral busses and associated devices, and through I/O bus 112. I/O bus 112 may be an input/output bus such as the PCI bus known in the art.

Figure 2:
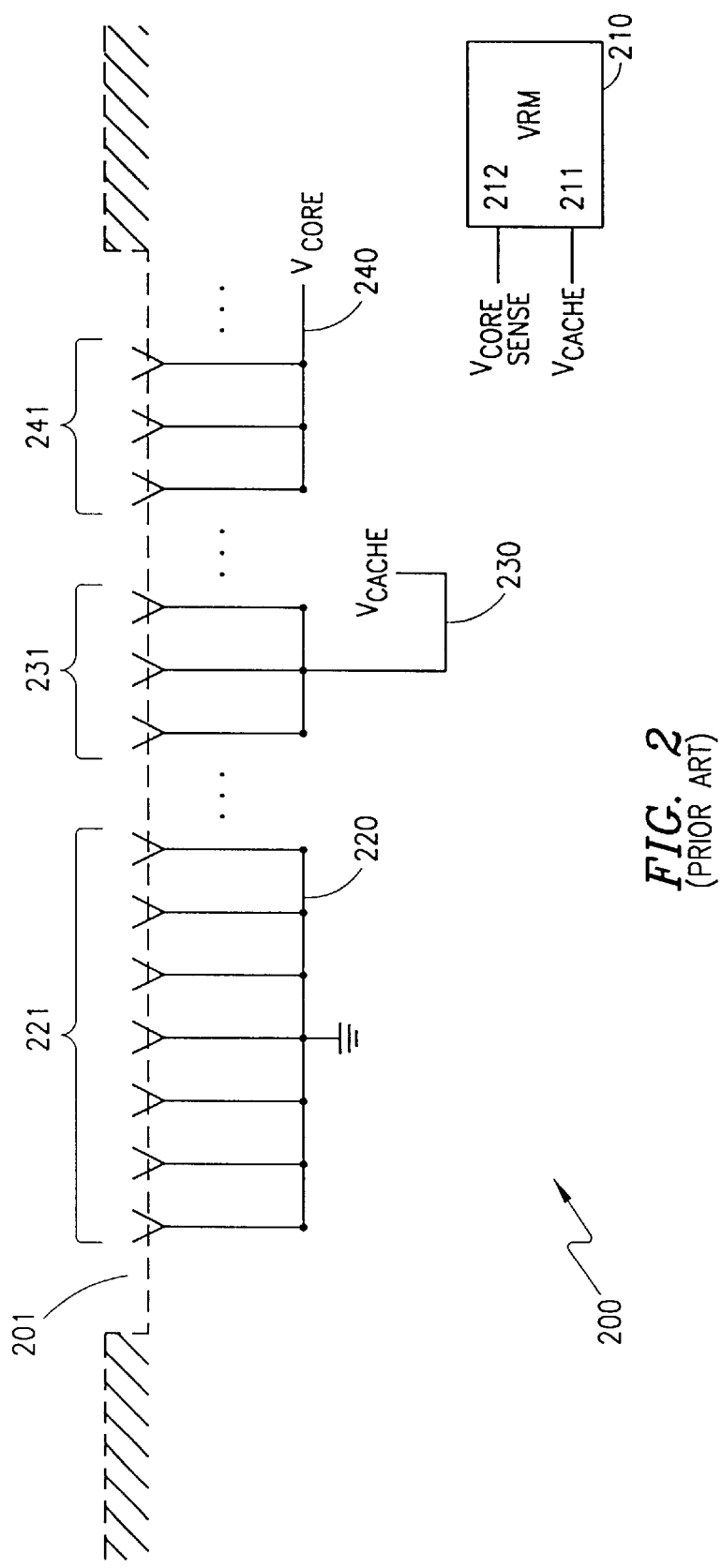
FIG. 2 is a schematic diagram illustrating a prior art circuit including ground and power contacts and an exemplary voltage regulation module.

While FIG. 1 shows multiple processors 120a–120h it is to be noted, as previously described, that the present invention may be practiced on a single processor or multiple processors. By way of example and not limitation, the remaining description is relevant to the present invention in the context of a single processor but could be applied to as many processors as may be present. Referring now to FIG. 2 of the drawings, a schematic of circuit board 200 shows socket 201 for accepting a processor. In prior art computer systems, such as computer system 100, a plurality of ground contacts 221 are grouped together to provide enhanced current sourcing capability from processor ground contacts to ground 220 which may be a ground plane or ground grid fabricated into or otherwise coupled to circuit board 200. Similarly, one or more voltage supplies may be provided to the processor through contacts 231 associated with, for example, $V_{CACHE}$ 230 and contacts 241 associated with, for example, $V_{CORE}$ 240. Voltage Regulation Module 210 may further be provided to regulate voltage supplies, for example, $V_{CACE}$ 230 $V_{CORE}$ 240 by sensing voltage levels at respective voltage sense lines 211 and 212 respectively.

Problems arise, however, in merely connecting voltage sense lines 211 and 212 to a point on the voltage plane for the associated voltage supply. While the connection point may be convenient to the location of VRM 210, it may be remote from its point of use especially when the voltage supplies are used primarily or exclusively within the processor as may be the case, for example, with $V_{CACHE}$ 230 and $V_{CORE}$ 240. Voltage drops which may occur between VRM 210 and processor segments to which supply voltages are destined such as, for example, the processor core in the case of $V_{CORE}$ 240 and processor address cache in the case of $V_{CACHE}$ 230 may result in poor or inadequate regulation of voltage levels and, accordingly, may compromise the operation of the processor and the system.

Figure 3A:
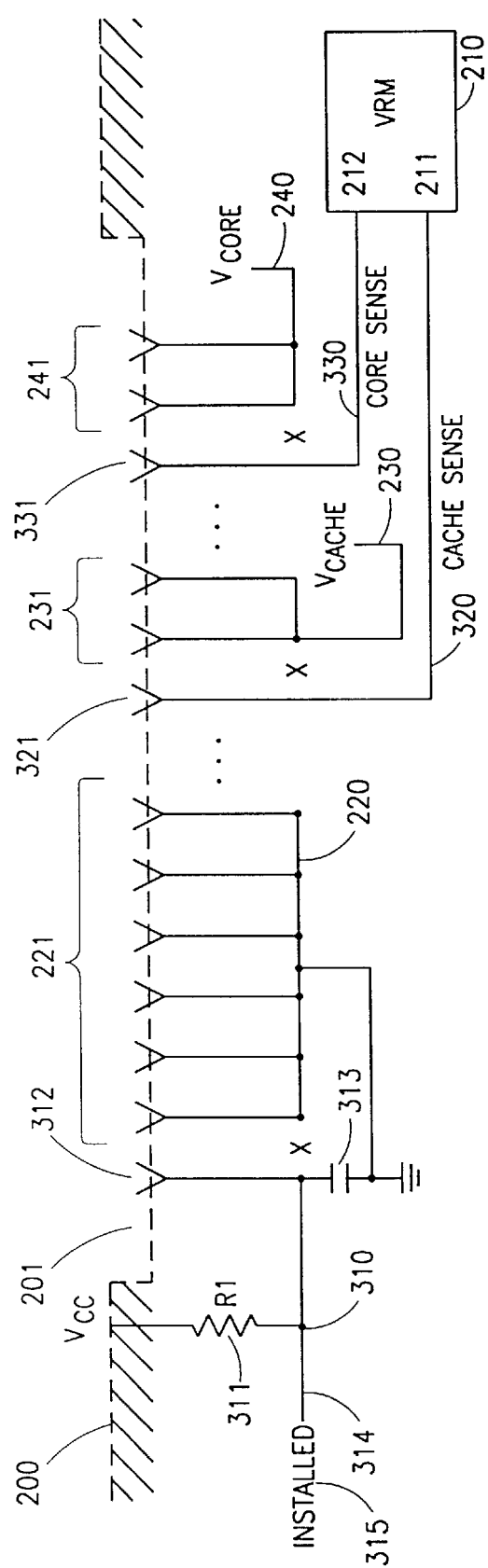
FIG. 3A is a schematic diagram illustrating a circuit including contacts isolated from ground and power contacts and related circuits in accordance with the present invention.

As best illustrated in FIG. 3A, circuit board 200 may be provided with a plurality of ground contacts 221 as would be conventional. However, in accordance with the present invention, signal generating circuit 310 may be used to provide a positive indication of the presence or absence of a processor in socket 201. In order to generate such a signal, at least one of the plurality of ground contacts 221 may be electrically isolated within circuit board 200 from the other ground contacts 221 to form signal contact 312. Further, pull-up resistor 311 may be coupled to signal contact 312 and $V_{CC}$. Filter capacitor 313 may be coupled to signal contact 312 and, in the preferred embodiment, ground plane 220 of circuit board 200 or suitable ground connection having the same ground reference as ground plane 220. Signal line 314 may be coupled to the common node of resistor 311, capacitor 313, and signal contact 312 for providing INSTALLED signal 315 which may be generated as described hereinafter.

With further reference to FIG. 3A of the drawings, improved voltage regulation by VRM 210 may be achieved by isolating, from a plurality of power contacts 231 associated with supply voltage $V_{CACHE}$ 230, at least one cache voltage sense contact 321. Similarly, at lease one core voltage sense contact 331 may be isolated from a plurality of power contacts 241 associated with supply voltage $V_{CORE}$ 240. Cache and core voltage sense contacts 321 and 331 may further be coupled directly to VRM 210 at sense terminals 211 and 212 respectively. In such a manner, improved sensing can be accomplished as described in greater detail hereinafter.

A better understanding of the generation of INSTALLED signal 315 and improved voltage regulation may be had with reference to FIG. 3B of the drawings. Processor 300 may be a typical high performance processor used alone or in a multi-processor computer system 100 as shown in FIG. 1. Circuit board 200, as previously described, may be equipped with socket 201 to accept processor 300 therein. Processor 300 may be secured with mechanical assistance provided by a cartridge or similar package not shown, or through solder connections. Further, processor 300 may be electrically coupled to circuit board 200 using a variety of methods known and commonly used in the art such as 320 pin grid arrays or simple contact arrays or the like. To provide ground connection to ground plane 220 of circuit board 200, ground contacts 304 may be coupled internally to electrical ground circuit or substrate 301 of processor 300. In making the connection between contacts 304 and corresponding contacts 221 of ground plane 220, signal contact 312 is now coupled through processor 300 to ground. INSTALLED signal 315 will now be pulled low due to signal line 314 being coupled directly to ground plane 220 or similar ground reference having the same ground reference as ground plane 220 through processor 300. Prior to installing processor 300, INSTALLED signal 315 may be pulled high through resistor 311 since signal line 314 will float when the processor is not installed. This is possible since there is no DC coupling to ground plane 220 until the installation of 300 processor completes the circuit to ground. The operation of INSTALLED signal 315 may best be illustrated in FIG. 3C. The portion of graph 350 from t=0 to $t=T_{install}$ represents processor 300 being absent from circuit board 200 and a resulting high voltage level is seen for INSTALLED signal 315. After installing processor 300 into circuit board 200, represented by $t=T_{install}$ at point 351 on graph 350 and thereafter, INSTALLED signal 315 is pulled to ground as illustrated for as long as processor 300 remains in socket 201.

Referring back to FIG. 3B, processor 300 may be coupled to VRM 210 to provide more accurate voltage regulation for critical processor circuits. To accomplish improved regulation in accordance with the present invention, cache sense line 320 may be coupled to cache voltage line 302 of processor 300 through contacts 305 which are also coupled at contacts 231 to $V_{CACHE}$ 230 to provide the supply voltage. By improving the proximity of cache sense line 320 toward the processor a more accurate voltage level may be sensed and correspondingly regulated by VRM 210 through sense terminal 211 without stray voltage fluctuation not directly associated with processor operation as seen at processor contacts. To improve regulation of processor 300 core voltage, in a manner similar to cache voltage regulation, core sense line 330 may be coupled to core voltage line 303 of processor 300 through contacts 306 which also come into contact at contacts 241 with $V_{CORE}$ 240. While two exemplary supply voltages are shown as being coupled to processor 300, more or fewer voltage supplies may be present and may be regulated in accordance with the present invention.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A circuit board comprising:
   at least one socket having a plurality of contacts electrically coupling the at least one socket to the circuit board, the plurality of contacts including a plurality of ground contacts, one of the plurality of ground contacts being isolated from the remaining plurality of ground contacts; and
   a signal generating circuit that comprises a resistor-capacitor circuit electrically coupled to the one of the plurality of ground contacts, the signal generating circuit delivering a signal in response to an object being placed in the at least one socket.

2. The circuit board of claim 1 wherein the resistor-capacitor circuit comprises:
   a capacitor electrically coupled between the one isolated ground contact and ground; and
   a resistor electrically coupled between a voltage node and the capacitor.

3. A circuit board comprising:
   at least one socket having a plurality of contacts electrically coupling the at least one processor socket to the circuit board, the plurality of contacts including a plurality of ground contacts, one of the plurality of ground contacts being isolated from the remaining plurality of ground contacts; and
   a signal generating circuit electrically coupled to the one of the plurality of ground contacts, the signal generating circuit delivering a signal in response to a processor being placed in the at least one processor socket.

4. A circuit board comprising:
   at least one socket having a plurality of contacts electrically coupled to the circuit board, the plurality of contacts including at least one plurality of voltage supply contacts, at least one of the at least one plurality of voltage supply contacts being isolated from the remaining plurality of voltage supply contacts; and
   at least one voltage regulation module having at least one sense contact that comprises a cache voltage sense contact electrically coupled to the at least one isolated voltage supply contact and having at least one supply contact electrically coupled to the at least one plurality of voltage supply contacts.

5. The circuit board of claim 4 wherein the at least one supply contact comprises a cache voltage supply contact.

6. A circuit board comprising:
   at least one socket having a plurality of contacts electrically coupled to the circuit board, the plurality of contacts including at least one plurality of voltage supply contacts, at least one of the at least one plurality of voltage supply contacts being isolated from the remaining plurality of voltage supply contacts; and
   at least one voltage regulation module having at least one sense contact that comprises a core voltage sense contact electrically coupled to the at least one isolated voltage supply contact and having at least one supply contact electrically coupled to the at least one plurality of voltage supply contacts.

7. The circuit board of claim 6 wherein the at least one supply contact comprises a core voltage supply contact.

8. The circuit board of claim 6 wherein the at least one sense contact comprises a cache voltage sense contact and wherein the at least one supply contact comprises a cache voltage supply contact and a core voltage supply contact.

9. A motherboard comprising:
   a plurality of sockets electrically coupled to the motherboard;
   at least one processor having at least one plurality of contacts electrically coupled to at least one of the plurality of sockets, the at least one plurality of contacts having at least one plurality of ground contacts;
   at least one contact isolated from the at least one plurality of ground contacts; and
   at least one signal generating circuit electrically that comprises at least one resistor-capacitor circuit coupled to the at least one isolated ground contact, the at least one signal generating circuit delivering a signal in response to the at least one processor being placed in at least one of the plurality of sockets.

10. The motherboard of claim 9 wherein the at least one resistor-capacitor circuit comprises:
    at least one capacitor electrically coupled between the at least one isolated ground contact and ground; and
    at least one resistor electrically coupled between at least one voltage node and the at least one capacitor.

11. A motherboard comprising:
    a plurality of sockets electrically coupled to the motherboard;
    at least one processor having at least one plurality of contacts electrically coupled to at least one of the plurality of sockets, the at least one plurality of contacts having at least one plurality of ground contacts;
    a memory;
    at least one contact isolated from the at least one plurality of ground contacts; and
    at least one signal generating circuit electrically coupled to the at least one isolated ground contact, the at least one signal generating circuit delivering a signal in response to the at least one processor being placed in at least one of the plurality of sockets.

12. The motherboard of claim 11 comprising at least one bus.

13. The motherboard of claim 11 comprising a controller.

14. A motherboard comprising:
    a plurality of sockets electrically coupled to the motherboard;
    at least one processor having at least one plurality of contacts electrically coupled to at least one of the plurality of sockets, the at least one plurality of contacts having at least one plurality of voltage supply contacts;
    at least one contact isolated from the at least one plurality of voltage supply contacts; and at least one voltage regulation module having at least one sense contact and at least one supply contact, the at least one sense contact electrically coupled to the at least one isolated contact and the at least one supply contact electrically coupled to the at least one plurality of voltage supply contacts.

15. The motherboard of claim 14 wherein the at least one sense contact comprises a cache voltage sense contact.

16. The motherboard of claim 15 wherein the at least one supply contact comprises a cache voltage supply contact.

17. The motherboard of claim 14 wherein the at least one sense contact comprises a core voltage sense contact.

18. The motherboard of claim 17 wherein the at least one supply contact comprises a core voltage supply contact.

19. The motherboard of claim 14 wherein the at least one sense contact comprises a cache voltage sense contact and a core voltage sense contact and wherein the at least one voltage supply contact comprises a cache voltage supply contact and a core voltage supply contact.

20. The motherboard of claim 14 comprising a memory.

21. The motherboard of claim 14 comprising at least one bus.

22. The motherboard of claim 14 comprising a controller.

23. A base comprising:
a motherboard comprising at least one processor socket electrically coupled to the motherboard, the at least one processor socket having at least one plurality of ground contacts;
at least one contact isolated from the at least one plurality of ground contacts;
at least one signal generating circuit that comprises at least one resistor-capacitor circuit electrically coupled to the at least one isolated contact, the at least one signal generating circuit delivering a signal in response to at least one processor being placed in the at least one processor socket;
at least one drive;
a power supply, and
at least one input device coupled to the base.

24. The base of claim 23 wherein the at least one resistor-capacitor circuit comprises:
at least one capacitor electrically coupled between the at least one isolated contact and ground; and
at least one resistor electrically coupled between at least one voltage node and the at least one capacitor.

25. A base comprising:
a motherboard comprising at least one processor socket electrically coupled to the motherboard, the at least one processor socket having at least one plurality of ground contacts;
a memory;
at least one contact isolated from the at least one plurality of ground contacts;
at least one signal generating circuit electrically coupled to the at least one isolated contact, the at least one signal generating circuit delivering a signal in response to at least one processor being placed in the at least one processor socket;
at least one drive;
a power supply; and
at least one input device coupled to the base.

26. The base of claim 25 wherein the motherboard comprises at least one bus.

27. The base of claim 25 wherein the motherboard comprises a controller.

28. The base of claim 25 comprising a display coupled to the base.

29. The base of claim 25 wherein the at least one drive comprises a plurality of drives.

30. The base of claim 25 wherein the at least one input device comprises a keyboard.

31. A base comprising:
a motherboard comprising at least one processor socket electrically coupled to the motherboard, the at least one processor socket having at least one plurality of voltage supply contacts;
at least one contact isolated from the at least one plurality of voltage supply contacts;
at least one voltage regulation module having at least one sense contact and at least one supply contact, the at least one sense contact electrically coupled to the at least one isolated contact and the at least one supply contact electrically coupled to the at least one plurality of voltage supply contacts;
at least one drive;
a power supply; and
at least one input device coupled to the base.

32. The base of claim 31 wherein the at least one sense contact comprises a cache voltage sense contact.

33. The base of claim 32 wherein the at least one supply contact comprises a cache voltage supply contact.

34. The base of claim 31 wherein the at least one sense contact comprises a core voltage sense contact.

35. The base of claim 34 wherein the at least one supply contact comprises a core voltage supply contact.

36. The base of claim 31 wherein the at least one sense contact comprises a cache voltage sense contact and a core voltage sense contact and wherein the at least one supply contact comprises a cache voltage supply contact and a core voltage supply contact.

37. The base of claim 31 wherein the motherboard comprises a memory.

38. The base of claim 31 wherein the motherboard comprises at least one bus.

39. The base of claim 31 wherein the motherboard comprises a controller.

40. The base of claim 31 comprising a display coupled to the base.

41. The base of claim 31 wherein the at least one drive comprises a plurality of drives.

42. The base of claim 31 wherein the at least one input device comprises a keyboard.

43. A method for manufacturing a circuit board comprising:
electrically coupling at least one socket having a plurality of contacts to the circuit board, the plurality of contacts including a plurality of ground contacts;
isolating one of the plurality of ground contacts from the remaining plurality of ground contacts;
constructing a signal generating circuit that comprises a resistor-capacitor circuit, the signal generating circuit delivering a signal in response to an object being placed in the at least one socket; and
electrically coupling the signal generating circuit to the one of the plurality of ground contacts.

44. The method of claim 43 wherein constructing the resistor-capacitor circuit comprises:
electrically coupling a capacitor between the one of the plurality of ground contacts and ground; and
electrically coupling a resistor between a voltage node and the capacitor.

45. A method for manufacturing a circuit board comprising:
- electrically coupling at least one processor socket having a plurality of contacts to the circuit board, the plurality of contacts including a plurality of ground contacts;
- isolating one of the plurality of ground contacts from the remaining plurality of ground contacts;
- constructing a signal generating circuit, the signal generating circuit delivering a signal in response to a processor being placed in the at least one processor socket; and
- electrically coupling the signal generating circuit to the one of the plurality of ground contacts.

46. A method for manufacturing a circuit board comprising:
- electrically coupling at least one socket having a plurality of contacts to the circuit board, the plurality of contacts including at least one plurality of voltage supply contacts;
- isolating at least one of the at least one plurality of voltage supply contacts from the at least one plurality of voltage supply contacts; and
- electrically coupling at least one sense contact of at least one voltage regulation module to the at least one isolated voltage supply contact and electrically coupling at least one supply contact of the at least one voltage regulation module to the at least one plurality of voltage supply contacts.

47. The method of claim 46 comprising electrically coupling the at least one sense contact to at least one isolated cache voltage supply contact.

48. The method of claim 47 comprising electrically coupling the at least one supply contact to at least one plurality of cache voltage supply contacts.

49. The method of claim 46 comprising electrically coupling the at least one sense contact to at least one isolated core voltage supply contact.

50. The method of claim 49 comprising electrically coupling the at least one supply contact to at least one plurality of core voltage supply contacts.

51. The method of claim 46 wherein electrically coupling at least one sense contact comprises electrically coupling a cache voltage sense contact to at least one isolated cache voltage supply contact and electrically coupling a core voltage sense contact to at least one plurality of core voltage supply contacts and wherein electrically coupling at least one supply contact comprises electrically coupling a cache voltage supply contact to at least one plurality of cache voltage supply contacts and electrically coupling a core voltage supply contact to at least one plurality of core voltage supply contacts.

52. The method of claim 46 wherein the socket comprises a processor socket and wherein the object comprises a processor.

* * * * *